United States Patent
Cheng et al.

(10) Patent No.: US 9,219,154 B1
(45) Date of Patent: Dec. 22, 2015

(54) METHOD OF FABRICATING ELECTROSTATICALLY ENHANCED FINS AND STACKED NANOWIRE FIELD EFFECT TRANSISTORS

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/331,857

(22) Filed: Jul. 15, 2014

(51) Int. Cl.
| | |
|---|---|
| H01L 29/00 | (2006.01) |
| H01L 29/78 | (2006.01) |
| H01L 29/66 | (2006.01) |
| H01L 29/06 | (2006.01) |
| H01L 21/02 | (2006.01) |
| H01L 21/3105 | (2006.01) |
| H01L 21/308 | (2006.01) |
| H01L 29/417 | (2006.01) |
| H01L 21/84 | (2006.01) |

(52) U.S. Cl.
CPC ...... *H01L 29/7851* (2013.01); *H01L 21/02233* (2013.01); *H01L 21/02603* (2013.01); *H01L 21/3081* (2013.01); *H01L 21/3105* (2013.01); *H01L 21/845* (2013.01); *H01L 29/0673* (2013.01); *H01L 29/41791* (2013.01); *H01L 29/66795* (2013.01); *H01L 29/66818* (2013.01); *H01L 29/7853* (2013.01)

(58) Field of Classification Search
CPC .............. H01L 29/66818; H01L 29/66795; H01L 29/41791; H01L 21/845
See application file for complete search history.

(56) References Cited

U.S. PATENT DOCUMENTS

| | | | |
|---|---|---|---|
| 7,892,945 B2 | 2/2011 | Bedell et al. | |
| 2010/0065887 A1 | 3/2010 | Goebel et al. | |
| 2011/0298058 A1* | 12/2011 | Kawasaki et al. | 257/401 |
| 2013/0234215 A1* | 9/2013 | Okano | 257/255 |
| 2014/0231919 A1* | 8/2014 | Peng et al. | 257/368 |
| 2015/0206939 A1* | 7/2015 | Huang et al. | 257/77 |

(Continued)

OTHER PUBLICATIONS

Sacchetto, D., et al., "Design aspects of carry look ahead adders with vertically-stacked nanowire transistors", Published in: Circuits and Systems (ISCAS), Proceedings of 2010 IEEE International Symposium, Date of Conference: May 30, 2010-Jun. 2, 2010, pp. 1715-1718.

(Continued)

*Primary Examiner* — Ngan Ngo
(74) *Attorney, Agent, or Firm* — Scully, Scott, Murphy & Presser, P.C.; Louis J. Percello, Esq.

(57) ABSTRACT

Non-planar semiconductor devices including semiconductor fins or stacked semiconductor nanowires that are electrostatically enhanced are provided. The electrostatic enhancement is achieved in the present application by epitaxially growing a semiconductor material protruding portion on exposed sidewalls of alternating semiconductor material portions of at least one hard mask capped semiconductor-containing fin structure that is formed on a substrate.

7 Claims, 10 Drawing Sheets

(56) References Cited

U.S. PATENT DOCUMENTS

2015/0214105 A1* 7/2015 Zhang et al. ............... 438/586
2015/0221724 A1* 8/2015 Kerber et al. ............... 257/288

OTHER PUBLICATIONS

Song, Y., et al., "Vertically stacked individually tunable nanowire field effect transistors for low power operation with ultrahigh radio frequency linearity", Applied Physics Letters 101, Published online Aug. 30, 2012, pp. 093509-1 to 093509-4.

Wang, T., et al., "Fabrication of vertically stacked single-crystalline Si nanowires using self-limiting oxidation", Nanotechnology, Published Dec. 8, 2011, 23, pp. 015307-1 to 015307-5.

Buddharaju, K.D., et al., "Gate-All-Around Si-Nanowire CMOS Inverter Logic Fabricated using Top-down Approach", Solid State Device Research Conference, Sep. 11-13, 2007, 37th European pp. 303-306.

Dupre, C., et al., "15nm-diameter 3D Stacked Nanowires with Independent Gates Operation: PHI-FET", Electron Devices Meeting, IEDM, IEEE International, Date of Conference: Dec. 15-17, 2008, pp. 1-4.

\* cited by examiner

METHOD OF FABRICATING ELECTROSTATICALLY ENHANCED FINS AND STACKED NANOWIRE FIELD EFFECT TRANSISTORS

BACKGROUND

The present application relates to non-planar semiconductor devices and methods of forming the same. More particularly, the present application relates to non-planar semiconductor devices including semiconductor fins or stacked semiconductor nanowires that are electrostatically enhanced and methods of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, gate-all-around semiconductor nanowire field effect transistors (FETs) is the next step in the evolution of complementary metal oxide semiconductor (CMOS) devices. Semiconductor nanowire field effect transistors (FETs) can achieve higher drive currents with increasingly smaller dimensions as compared to conventional planar FETs. In its basic form, a semiconductor nanowire FET includes a source, a drain and one or more nanowire channels between the source and the drain. A gate electrode, which wraps around the one or more nanowire channels, regulates electron flow through the nanowire channel between the source and drain.

Despite being promising candidates for the end of the CMOS road map due to their excellent electrostatic control, semiconductor devices containing prior art gate-all-around semiconductor nanowires oftentimes sag and buckle due to gate stress or stress relaxation. Moreover, and for a gate last process, there are currently no good solutions to remove the sacrificial gate material under the semiconductor nanowires.

SUMMARY

Non-planar semiconductor devices including semiconductor fins or stacked semiconductor nanowires that are electrostatically enhanced are provided. The term "electrostatically enhanced" is used throughout the present application to denote a non-planar semiconductor device having better electrostatic integrity than a state of the art non-planar semiconductor structure. The electrostatic enhancement is achieved in the present application by epitaxially growing a semiconductor material protruding portion on exposed sidewalls of alternating semiconductor material portions of at least one hard mask capped semiconductor-containing fin structure that is formed on a substrate.

In one embodiment of the present application, a method is provided that includes providing a semiconductor-containing fin structure on a surface of a base layer, wherein the semiconductor-containing fin structure comprises, from bottom to top, and in an alternating manner, at least one first semiconductor material portion having a first oxidation rate, and at least one second semiconductor material portion having a second oxidation rate, wherein the first oxidation rate is slower than the second oxidation rate. Next, an oxidation process is performed to form a continuous oxide liner on semiconductor sidewall surfaces of the semiconductor-containing fin structure, wherein the continuous oxide liner comprises a first oxide liner portion having a first thickness and located on each of the first semiconductor material portions and a second oxide liner portion having a second thickness that is greater than the first thickness and located on each of the second semiconductor material portions. After the oxidation process, the first oxide liner portion is removed from each of the first semiconductor material portions, while partially removing the second oxide liner portion from each of the second semiconductor material portions. A semiconductor material protruding portion is then epitaxially grown from an exposed semiconductor sidewall surface of each of the first semiconductor material portions.

In another embodiment of the present application, a method of forming a semiconductor structure is provided that includes providing a semiconductor-containing fin structure on a surface of a base layer, wherein the semiconductor-containing fin structure comprises, from bottom to top, and in an alternating manner, at least one first semiconductor material portion having a first oxidation rate, and at least one second semiconductor material portion having a second oxidation rate, wherein the first oxidation rate is slower than the second oxidation rate. Next, an oxidation process is performed to form an oxide liner portion on each of the first semiconductor material portions and to completely convert each of the second semiconductor material portions into an oxide structure. The oxide liner portion is removed from each of the first semiconductor material portions and each oxide structure is also removed. A semiconductor material protruding portion is epitaxially grown from an exposed semiconductor sidewall surface of each of the first semiconductor material portions.

In one embodiment of the present application, a semiconductor structure is provided that includes a semiconductor-containing fin structure on a surface of a base layer, wherein the semiconductor-containing fin structure comprises, from bottom to top, and in an alternating manner, at least one first semiconductor material portion, and at least one second semiconductor material portion, wherein each of the at least one second semiconductor material portions has a width that is less than a width of each of the at least one first semiconductor material portions. An oxide cap portion is located on a sidewall of each of the at least one second semiconductor material portions, wherein a sidewall surface of the oxide cap portion is vertically coincident with a sidewall surface of each of the at least one first semiconductor material portions. A semiconductor material protruding portion is located on the sidewall surface of each of the first semiconductor material portions.

In another embodiment of the present application, a semiconductor structure is provided that includes a vertical stack of semiconductor nanowires located atop on a surface of a base layer, and a semiconductor material protruding portion located on a sidewall surface of each of the semiconductor nanowires.

DETAILED DESCRIPTION

Figure 1:
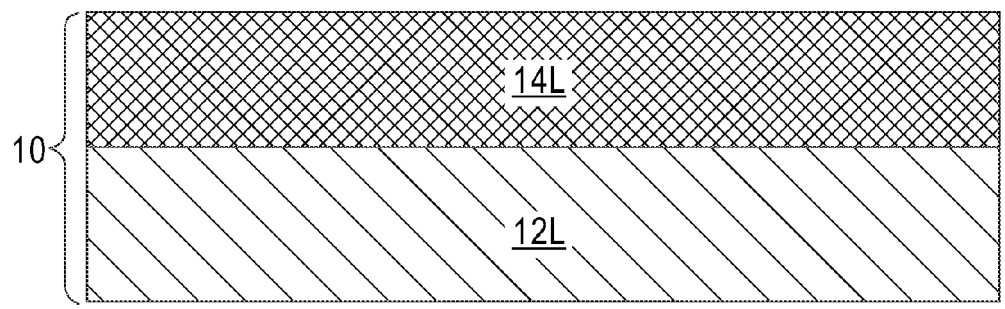
FIG. 1 is a cross sectional view of a first exemplary semiconductor structure including a substrate containing at least a semiconductor-containing layer of a first semiconductor material in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements in the various embodiments of the present application are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated a first exemplary semiconductor structure including a substrate 10 containing, from bottom to top, a base layer 12L and a semiconductor-containing layer 14L of a first semiconductor material in accordance with an embodiment of the present application.

In some embodiments of the present application, the substrate 10 can be a bulk semiconductor substrate. In such an embodiment, the entirety of the substrate 10 including the semiconductor-containing layer 14L and the base layer 12L is comprised of a semiconductor material. In one embodiment, the base layer 12L may comprise a same semiconductor material as the semiconductor-containing layer 14L, i.e., layers 12L and 14L are of unitary construction and are both comprised of a first semiconductor material. In another embodiment, the base layer 12L may comprise a different semiconductor material than the semiconductor-containing layer 14L.

When substrate 10 is a bulk substrate, the semiconductor material providing the base layer 12L and semiconductor-containing layer 14L can be comprised of any semiconductor material including, but not limited to, Si, Ge, SiGe, SiC, SiGeC, and III/V compound semiconductors such as, for example, InAs, GaAs, and InP. In one embodiment in which substrate 10 is a bulk substrate, each of the base layer 12L and semiconductor-containing layer 14L can be comprised of a single crystalline semiconductor material, such as, for example, single crystalline silicon or a single crystalline silicon germanium alloy. In other embodiments in which substrate 10 is a bulk substrate, each of the base layer 12L and semiconductor-containing layer 14L can be comprised of a polycrystalline or amorphous semiconductor material.

In another embodiment, the substrate 10 is a semiconductor-on-insulator (SOI) substrate. In this embodiment, base layer 12L may comprise an insulator layer, or a stack of, from bottom to top, of a handle substrate and an insulator layer. In such an embodiment, the semiconductor-containing layer 14L of the first semiconductor material is positioned on a dielectric surface of substrate 10.

When an SOI substrate is used as substrate 10, the handle substrate (not specifically illustrated) and the semiconductor-containing layer 14L may comprise the same, or different, semiconductor material, as defined above. In one embodiment, the handle substrate (not specifically shown) and the semiconductor-containing layer 14L are both comprised of silicon or a silicon germanium alloy. In some embodiments, the handle substrate (not specifically shown) is a non-semiconductor material including, for example, a dielectric material and/or a conductive material. In yet other embodiments, the handle substrate can be omitted, and substrate 10 includes an insulator layer as base layer 12L in which the semiconductor-containing layer 14L is located thereon.

In some embodiments, the handle substrate (not specifically shown) and the semiconductor-containing layer 14L may have the same or different crystal orientation. For example, the crystal orientation of the handle substrate and/or the semiconductor-containing layer 14L may be {100}, {110}, or {111}. Other crystallographic orientations besides those specifically mentioned can also be used in the present application. The handle substrate and/or the semiconductor-containing layer 14L of the SOI substrate may be a single crystalline semiconductor material, a polycrystalline material, or an amorphous material. Typically, at least the semiconductor-containing layer 14L is a single crystalline semiconductor material.

When the base layer 12L of substrate 10 includes an insulator layer, the insulator layer providing at least a portion of base layer 12L may be a crystalline or non-crystalline oxide or nitride. In one embodiment, an oxide such as, for example, silicon dioxide can be used for at least a portion of base layer 12L. When present, the insulator layer providing at least a portion of base layer 12L may be continuous or it may be discontinuous. When a discontinuous insulator region is present, the insulator region can exists as an isolated island that is surrounded by semiconductor material.

When substrate 10 is an SOI substrate, the SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor-containing layer 14L to a layer having a thickness that is more desirable.

In one example, the thickness of the semiconductor-containing layer 14L of the SOI substrate can be from 100 Å to 1000 Å. In another example, the thickness of the semiconductor-containing layer 14L of the SOI substrate can be from 500 Å to 700 Å. In some embodiments, and when an ETSOI (extremely thin semiconductor-on-insulator) substrate is employed, the semiconductor-containing layer 14L of the ETSOI substrate has a thickness of less than 100 Å. If the thickness of the semiconductor-containing layer 14L is not within one of the above mentioned ranges, a thinning step such as, for example, planarization or etching can be used to reduce the thickness of the semiconductor-containing layer 14L to a value within one of the ranges mentioned above. When a portion of the base layer 12L of substrate 10 is an insulator layer of an SOI substrate, the insulator layer providing at least a portion of the base layer 12L typically has a thickness from 10 Å to 2000 Å, with a thickness from 1000 Å to 1500 Å being more typical. The thickness of the handle substrate of the SOI substrate is inconsequential to the present application.

Figure 2:
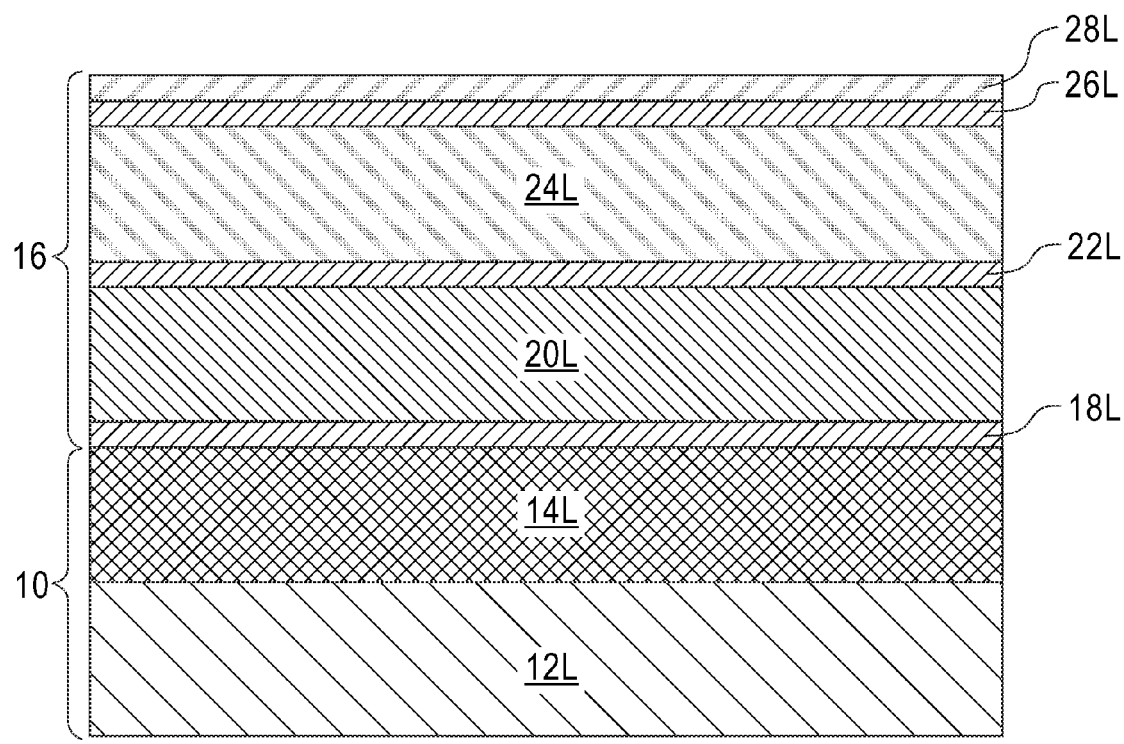
FIG. 2 is a cross sectional view of the first exemplary semiconductor structure of FIG. 1 after forming a semiconductor material stack on the semiconductor-containing layer and after forming a hard mask layer on an uppermost surface of the semiconductor material stack.

Referring now to FIG. 2, there is illustrated the first exemplary semiconductor structure of FIG. 1 after forming a semiconductor material stack 16 on the semiconductor-containing layer 14L and after forming a hard mask layer 28L on an uppermost surface of the semiconductor material stack 16.

The semiconductor material stack 16 of the present application includes a plurality of vertically stacked semiconductor-containing layers which contain, in an alternating manner, a semiconductor-containing layer of a second semiconductor material (e.g., layers 18L, 22L, and 26L), and a semiconductor-containing layer of the first semiconductor material (e.g., layers 20L and 24L). In accordance with the present application, the second semiconductor material that provides semiconductor-containing layers 18L, 22L, and 26L comprises a different semiconductor material than the first semiconductor material that provides the semiconductor-containing layer 14L of substrate 10 and semiconductor-containing layers 20L and 24L of semiconductor material stack 16. In the present application, the first semiconductor material that is used in providing semiconductor-containing layer 14L, semiconductor-containing layer 20L and semiconductor-containing layer 24L has an oxidation rate that is slower than that of the second semiconductor material that is used in providing semiconductor-containing layer 18L, semiconductor-containing 22L and semiconductor-containing layer 26L.

The number of alternating layers of first and second semiconductor materials that provides semiconductor material stack 16 is not limited to the number illustrated in the present application. For example, and in one embodiment, the semiconductor material stack may contain a first layer of the second semiconductor material, a second layer of the first semiconductor material and a third of the second semiconductor material which layers are vertically stacked in an alternating manner one atop the other and atop semiconductor-containing layer 14L.

In some embodiments of the present application, the semiconductor material stack can only consist of a single layer of the second semiconductor material formed directly on top of the semiconductor-containing layer 14L; no first semiconductor-containing layer is formed. In such an embodiment, the hard mask layer 28L would be formed directly on the single layer of the second semiconductor material.

In accordance with the present application, the semiconductor-containing layer 14L of the first semiconductor material and each semiconductor material providing the semiconductor material stack 16 are non-doped. That is, the semiconductor layer 14L and semiconductor material stack 16 do not contain n-type or p-type dopants at this stage of the present application.

The second semiconductor material that provides some of the layers within the semiconductor material stack 16 may comprise any of the semiconductor materials mentioned for the first semiconductor material that provides semiconductor-containing layer 14L provided that the first semiconductor material has a slower oxidation rate as compared to the second semiconductor material.

In one embodiment, the first semiconductor material that provides the semiconductor-containing layer 14L of substrate 10, as well as second layer 20L and fourth layer 24L of semiconductor material stack 16 can each be comprised of $Si_{1-x}Ge_x$ wherein x is 0 (i.e., pure silicon) to less than 1. Typically, x is 0 to 0.5. In such an embodiment, the second semiconductor material that provides, for example, the first layer 18L, the third layer 22L, and the fifth layer 26L of the semiconductor material stack 16, is comprised of $Si_{1-y}Ge_y$, wherein y is greater than x and is from 0.1 to 1.

In some embodiments of the present application, the first and second semiconductor materials that are used in providing the various layers of the semiconductor material stack 16 may be single crystalline. In other embodiments of the present application, the first and second semiconductor materials that are used in providing the various layers of the semiconductor material stack 16 may be polycrystalline. In yet other embodiments of the present application, the first and second semiconductor materials that are used in providing the various layers of the semiconductor material stack 16 may be amorphous.

The semiconductor material stack 16 including the alternating layers of the second semiconductor material and layers of the first semiconductor material can be formed utilizing any epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. Thus, in the present application, each layer containing the second semiconductor material and each layer containing the first semiconductor material within the semiconductor material stack 16 has an epitaxial relationship, i.e., same crystal orientation, with the underlying semiconductor material layer. Moreover, the bottommost layer of the semiconductor material stack 16, e.g., the first layer 18L, has an epitaxial relationship, i.e., same crystal orientation, with the semiconductor-containing layer 14L of substrate 10.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming each of the semiconductor materials that provide the semiconductor material stack 16 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the various semiconductor material layers of the semiconductor material stack 16 typically ranges from 550° C. to 900° C. Although higher temperature typically results in faster deposition, the faster deposition may result in crystal defects and film cracking.

A number of different source gases may be used for the deposition of the semiconductor material stack 16. In some embodiments, the source gas for the deposition of the various semiconductor materials within the semiconductor material stack 16 includes a silicon containing gas source, a germanium containing gas source, or a combination thereof. For example, an epitaxial Si layer may be deposited from a silicon gas source that is selected from silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, a vacuum may be broken between the epitaxial growth of each layer of different semiconductor material within the semiconductor material stack 16. In other embodiments, a vacuum may be maintained between the epitaxial growth of each layer of different semiconductor material within the semiconductor material stack 16.

Typically, the thickness of each layer (18L, 20L, 22L, 24L and 26L) of the semiconductor material stack 16 may range from 2 nm to 100 nm. More typically, the thickness of each layer 18L, 20L, 22L, 24L and 26L) of the semiconductor material stack 16 ranges from 5 nm to 20 nm. Typically, the layers of first semiconductor material, e.g., layers 20L and 24L, of the semiconductor material stack 16 have a thickness that is great than the layers of second semiconductor material, e.g., layers 18L, 22L and 26L, of the semiconductor material stack. As is shown in FIG. 2, each layer of semiconductor material (18L, 20L, 22L, 24L and 26L) that provides the semiconductor material stack 16 is a contiguous layer that spans the entirety of the uppermost surface of the semiconductor-containing layer 14L of substrate 10.

After forming the semiconductor material stack 16, a hard mask layer 28L is formed on an uppermost surface of the semiconductor material stack 16. In the particular embodiment illustrated in the drawing, the hard mask layer 28L is formed on an uppermost surface of the fifth layer 26L of the semiconductor material stack 16.

The hard mask layer 28L can be formed by providing a hard mask material on the exposed topmost surface of the semiconductor material stack 16. The hard mask material that can be used in providing the hard mask layer 28L may include a semiconductor oxide, a semiconductor nitride and/or a semiconductor oxynitride. In one embodiment, the hard mask material that can be used in providing the hard mask layer 28L can be comprised of silicon dioxide. In another embodiment, the hard mask material that can be used in providing the hard mask layer 28L can be comprised of silicon nitride. In yet another embodiment, the hard mask material that can be used in providing the hard mask layer 28L can be a stack comprised of, in any order, silicon dioxide and silicon nitride.

In some embodiments, the hard mask material that can be used in providing the hard mask layer 28L can be formed by a deposition process such as, for example, chemical vapor deposition (CVD) and plasma enhanced chemical vapor deposition (PECVD). In other embodiments, the hard mask material that can be used in providing the hard mask layer 28L can be formed by a thermal process such as, for example, thermal oxidation and/or thermal nitridation. In yet other embodiments, the hard mask material that can be used in providing the hard mask layer 28L can be formed by a combination of a deposition process and a thermal process. The thickness of the hard mask material that can be used in providing the hard mask layer 28L can range from 2 nm to 10 nm, with a thickness from 3 nm to 6 nm being more typical.

Figure 3:
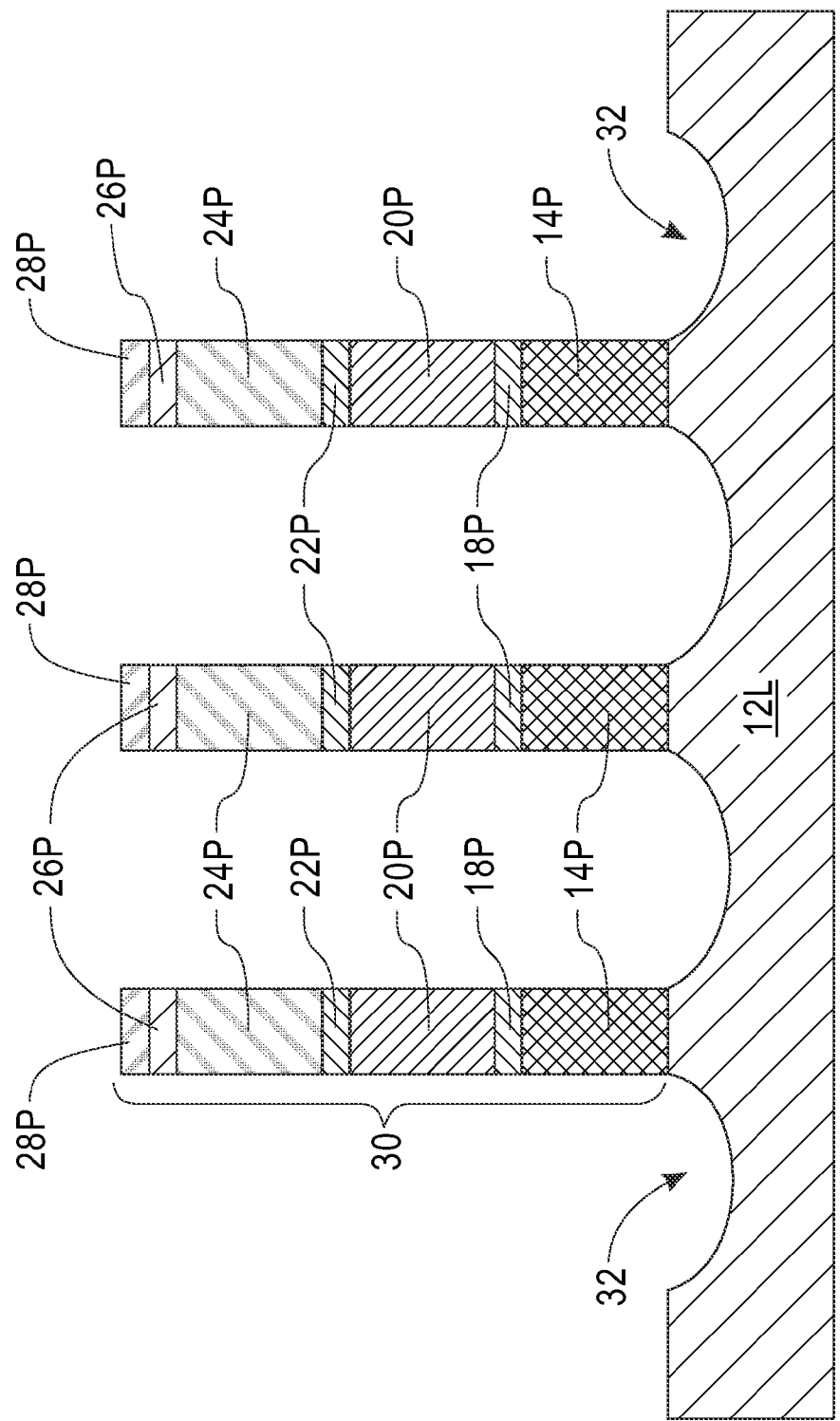
FIG. 3 is a cross sectional view of the first exemplary semiconductor structure of FIG. 2 after patterning the hard mask layer, the semiconductor material stack and the semiconductor-containing layer to form at least one hard mask capped semiconductor-containing fin structure located on the uppermost surface of the substrate.

Referring now to FIG. 3, there is illustrated the first exemplary semiconductor structure of FIG. 2 after patterning the hard mask layer 28L, the semiconductor material stack 16 and the semiconductor-containing layer 14L to form at least one hard mask capped semiconductor-containing fin structure 30 located on the uppermost surface of the base layer 12L of substrate 10. Each hard mask capped semiconductor-containing fin structure 30 that is formed is located on a different region of the base layer 12L of substrate 10 and has a bottommost surface that is in direct physical contact with a portion of the uppermost surface of the base layer 12L of substrate 10.

Each hard mask capped semiconductor-containing fin structure 30 includes, from top to bottom, a remaining portion of the hard mask layer 28L, remaining portions of the semiconductor material stack 16, and a remaining portion of the semiconductor-containing layer 14L. The remaining portion of the hard mask layer 28L that is present in each hard mask capped semiconductor-containing fin structure 30 can be referred to hereinafter as a hard mask portion 28P. The remaining portion of the semiconductor-containing layer 14L that is present in each hard mask capped semiconductor-containing fin structure 30 is hereinafter referred to as semiconductor-containing portion 14P. The remaining portions of the semiconductor material stack 16 are referred to herein as semiconductor stack portions; and are consecutively number first, second, third, fourth, fifth, etc.

Notably, and in the embodiment illustrated, the remaining portion of the first layer 18L of the semiconductor material stack 16 is referred to herein as a first semiconductor stack portion 18P, the remaining portion of the second layer 20L of the semiconductor material stack 16 is referred to herein as a second semiconductor stack portion 20P, the remaining portion of the third layer 22L of the semiconductor material stack 16 is referred to herein as a third semiconductor stack portion 22P, the remaining portion of the fourth layer 24L of the semiconductor material stack 16 is referred to herein as a fourth semiconductor stack portion 24P, and the remaining portion of the fifth layer 26L of the semiconductor material stack 16 is referred to herein as a fifth semiconductor stack portion 26P. Collectively, the semiconductor-containing portion 14P and each of the semiconductor stack portions 18P, 20P, 22P, 24P and 26P constitute a semiconductor-containing fin structure.

In accordance with the present application, the semiconductor-containing portion 14P and each of the semiconductor stack portions of the first semiconductor material may be referred to herein merely as a first semiconductor material portion, while each of the semiconductor stack portions of the second semiconductor material may be referred to herein merely as a second semiconductor material portion.

As is shown, the semiconductor-containing portion 14P represents the base semiconductor-containing material portion of each semiconductor-containing fin structure. As is also shown, each element of the hard mask capped semiconductor-containing fin structure 30 has sidewalls that are vertically coincident with, i.e., vertically aligned to, each other.

In accordance with the present application, each hard mask capped semiconductor-containing fin structure 30 has a first width, as measured from one sidewall of the hard mask capped semiconductor-containing fin structure 30 to another sidewall of the same hard mask capped semiconductor-containing fin structure 30, that is from 6 nm to 20 nm. Other widths that are greater than or lesser than the aforementioned width range can also be employed in the present application.

Each hard mask capped semiconductor-containing fin structure 30 may be formed by lithography and etching. Lithography can include forming a photoresist (not shown) on the topmost surface of hard mask layer 28L, exposing the photoresist to a desired pattern of radiation, and then developing the exposed photoresist with a conventional resist developer to provide a patterned photoresist atop the semiconductor substrate. At least one etch is then employed which transfers the pattern from the patterned photoresist into the hard mask layer 28L and then into the semiconductor material stack 16 and the semiconductor-containing layer 14L. In the illustrated embodiment, at least one etch can be used to transfer the pattern from the patterned photoresist material into each of the hard mask layer 28L, the semiconductor material stack 16, and the semiconductor-containing layer 14L. In some embodiments a portion of the base layer 12L may be recessed during this step of the present application; in such an embodiment, each hard mask capped semiconductor-containing fin structure 30 is located directly on a pedestal portion of base layer 12L. The recess region is labeled as element 32 in the drawings of the present application.

In one embodiment, the etch used for pattern transfer may include a dry etch process such as, for example, reactive ion etching, plasma etching, ion beam etching or laser ablation. In another embodiment, the etch used for pattern transfer may include a sidewall image transfer (SIT) process. After transferring the pattern, the patterned photoresist can be removed utilizing a conventional resist stripping process such as, for example, ashing.

In some embodiments of the present application (not shown), at least one sacrificial gate structure may now be formed that straddles each hard mask capped semiconductor-containing fin structure 30. The term "sacrificial gate structure" is used throughout the present application to denote a material that serves as a placeholder structure for a functional gate structure to be subsequently formed. The term "functional gate structure" is used throughout the present application as a permanent gate structure used to control output current (i.e., flow of carriers in the channel) of a semiconducting device through electrical or magnetic fields.

In embodiments in which sacrificial gate structures are formed, the sacrificial gate structure can be formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure.

After forming the sacrificial gate structure, a dielectric spacer may be formed on sidewalls of the sacrificial gate structure. The dielectric spacer can contain any dielectric spacer material including, for example, a dielectric oxide (e.g., silicon dioxide) and/or a dielectric nitride (e.g., silicon nitride). The dielectric spacer can be formed by first depositing the dielectric spacer material and then subjected the deposited dielectric spacer material to an anisotropic etch. In some embodiments, and prior to forming the dielectric spacer, source/drain extension regions (not shown) can be formed into the semiconductor material portions of each hard mask capped semiconductor-containing fin structure 30.

After forming the dielectric spacer, source regions and drain regions (also not shown) can be formed into exposed portions of the semiconductor portions of each hard mask capped semiconductor-containing fin structure 30 not protected by the sacrificial gate structure and the dielectric spacer by ion implantation. Following source/drain formation, the sacrificial gate structure and optionally the dielectric spacer can be removed and the process continues as shown in FIG. 4.

Figure 4:
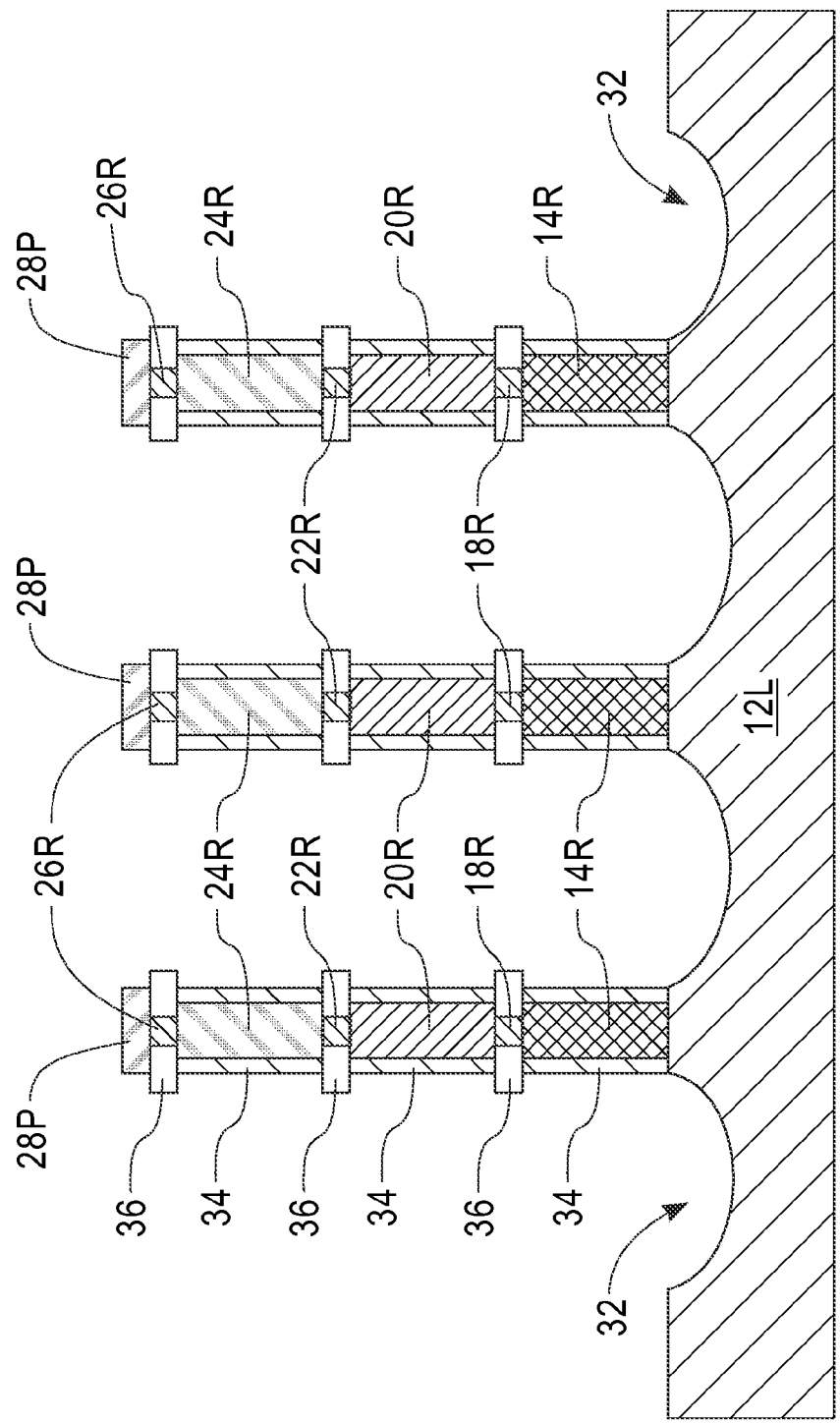
FIG. 4 is a cross sectional view of the first exemplary semiconductor structure of FIG. 3 after performing an oxidation process.

Specifically, FIG. 4 illustrates the first exemplary semiconductor structure of FIG. 3 after performing an oxidation process. In the illustrated embodiment, the oxidation process consumes portions of each semiconductor-containing fin structure (i.e., each semiconductor-containing portion 14P and each of the semiconductor stack portions 18P, 20P, 22P, 24P and 26P) and forms an oxide liner along sidewalls of each semiconductor-containing fin structure (i.e., each semiconductor-containing portion 14P and each of the semiconductor stack portions 18P, 20P, 22P, 24P and 26P). Each semiconductor-containing fin structure that remains includes a remaining portion of each semiconductor-containing portion 14P and each of the semiconductor stack portions 18P, 20P, 22P, 24P and 26P. The remaining portion of each semiconductor-containing portion 14P is labeled as 14R. The remaining portions of semiconductor stack portions 18P, 20P, 22P, 24P and 26P are labeled as 18R, 20R, 22R, 24R, and 26R. In accordance with the present application, the width of the remaining semiconductor-containing portion 14R is less than the width of semiconductor containing portion 14P, and the width of remaining semiconductor stack portions 18R, 20R, 22R, 24R and 26R are less than the widths of the original semiconductor stack portions 18P, 20P, 22P, 24P and 26P.

The amount of semiconductor consumption and thus thickness of the oxide liner that is formed depends on the oxidation rate of the various semiconductor materials that constituent each semiconductor material portion of the hard mask capped semiconductor-containing fin structure 30. In the embodiment that is illustrated, and since the semiconductor-containing portion 14P, the second semiconductor stack portion 20P and the fourth semiconductor stack portion 24P comprise a first semiconductor material that has a slower oxidation rate than the first semiconductor stack portion 18P, the third semiconductor stack portion 22P and the fifth semiconductor stack portion 26P, a first oxide liner portion 34 forms on the semiconductor-containing portion 14P, the second semiconductor stack portion 20P and the fourth semiconductor stack portion 24P that has a lesser thickness than a second oxide liner portion 36 that forms on the first, third and fifth semiconductor stack portions 18P, 22P and 26P. Thus, a structure is formed in which alternating semiconductor material portions contain a first oxide liner portion 34 having a first thickness, while the remaining alternating semiconductor material portions contain a second oxide liner portion 36 having a second thickness that is less than the first thickness. The first oxide liner portions 34 and the second oxide liner portions 36 constitute a contiguous oxide liner that is present on the sidewall surfaces of the hard mask capped semiconductor-containing fin structure 30. Note that the second oxide liner portions 36 have sidewalls that extend beyond the sidewalls of the first oxide liner portions 36.

In one embodiment of the present application, the oxidation process can be performed at a temperature from 600° C. to 1200° C. In another embodiment of the present application, the oxidation process can be performed at a temperature from 800° C. to 1000° C. Moreover, the oxidation process can be performed in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The oxidation process of the present application may be carried out for a variable period of time. In one example, the oxidation process can be carried out for a time period from 5 seconds to about 5 hours, depending on thermal oxidation temperature and oxidation species. In another embodiment, the oxidation process may be carried out for a time period from 5 minutes to about 30 minutes. The oxidation process of the present application may be carried out at a single targeted temperature, or various ramp and soak cycles using various ramp rates and soak times can be employed.

Following the oxidation process, the remaining second semiconductor material portions, e.g., 18R, 22R and 26R that contain the thicker oxide liner portions, e.g., second oxide portions 36, have a thickness that is now less than the thickness of the remaining first semiconductor material portions, e.g., 14R, 20R and 24R that contain the thinner oxide liner, e.g., the first oxide liner portions 34. This variation in thickness is a result of the etch rate of the various semiconductor material portions of the hard mask capped semiconductor-containing fin structure 30.

In some embodiments of the present application and depending on the material of the base layer 12L, a surface oxide layer may form on an exposed surface of the base layer 12L. This typically occurs in instances in which the base layer 12L comprises a semiconductor material. In other embodiments, and as is the case shown in FIG. 4, no surface oxide forms on the exposed surface of the base layer 12L. This typically occurs in instances in which base layer 12L is comprised of an insulator layer.

Figure 5:
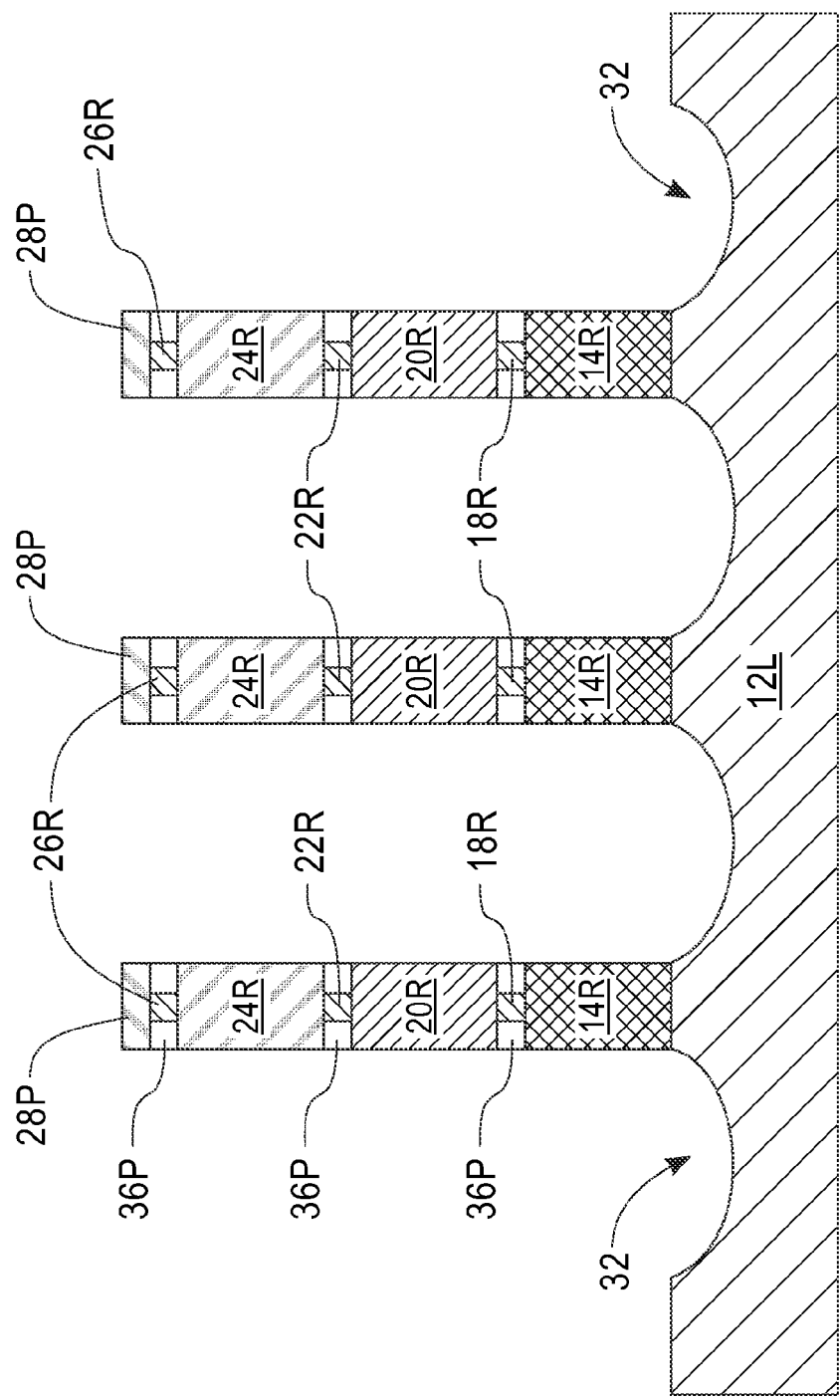
FIG. 5 is a cross sectional view of the first exemplary semiconductor structure of FIG. 4 after performing an oxide removal process.

Referring now to FIG. 5, there is illustrated the first exemplary semiconductor structure of FIG. 4 after subjecting the structure to an oxide removal process. The oxide removal process completely removes the first oxide liner portion 34 and at the same time partially removes the second oxide liner portion 26 from each hard mask capped semiconductor-containing fin structure 30. Because the second oxide liner portion 36 is thicker than the first oxide liner portions 34, an oxide cap portion 36p constituting a remaining portion of the second oxide liner portion 36 remains on the remaining second semiconductor material portions, e.g., 18R, 22R and 26R, of the at least one hard mask capped semiconductor-containing fin structure 30. The oxide removal process that can be performed comprises an isotropic etching process such as for example.

In some embodiments (not shown), and if the hard mask material layer comprises an oxide, the hard mask portion 28P can be removed at this stage of the present application. In other embodiments, the hard mask portion 28P remains after the oxide removal process. As shown, each oxide cap portion 36p has sidewalls that are vertically aligned with exposed sidewalls of alternating first semiconductor material portions 14R, 20R and 24R of the at least one hard mask capped semiconductor-containing fin structure 30.

Figure 6:
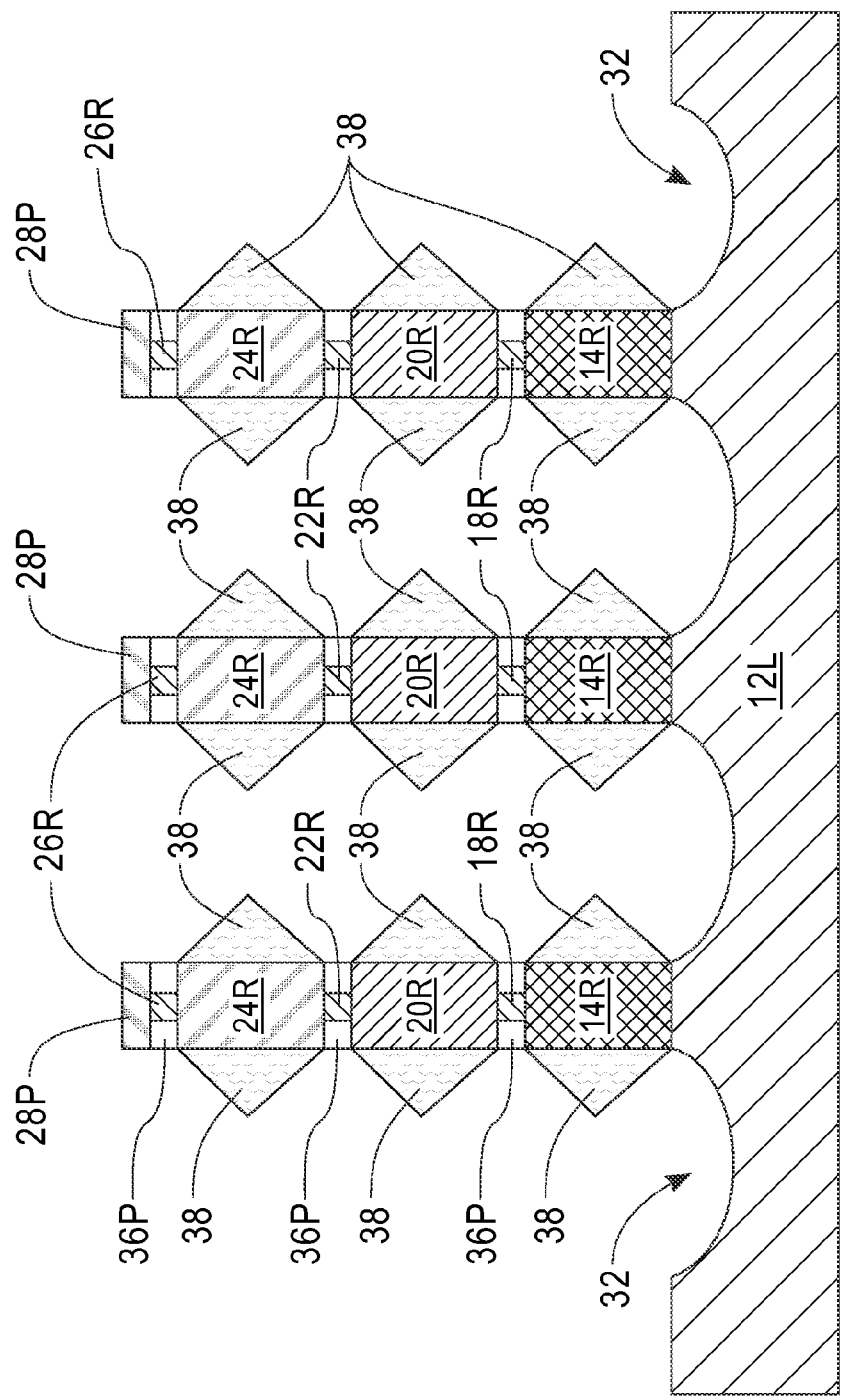
FIG. 6 is a cross sectional view of the first exemplary semiconductor structure of FIG. 5 after epitaxially growing a semiconductor material protruding portion on exposed semiconductor sidewalls of alternating semiconductor material portions of the at least one hard mask capped semiconductor-containing fin structure.

Referring now to FIG. 6, there is illustrated the first exemplary semiconductor structure of FIG. 5 after epitaxially growing a semiconductor material protruding portion 38 on exposed sidewalls of the alternating first semiconductor material portions 14R, 20R, and 24R of the at least one hard mask capped semiconductor-containing fin structure 30. No semiconductor material protruding portion is formed from the sidewalls of the oxide cap portions 36p.

In one embodiment of the present application, each semiconductor material protruding portion 38 comprises a same semiconductor material as that of the alternating first semiconductor material portions 14R, 20R and 24R of the at least one hard mask capped semiconductor-containing fin structure 30 which it is grown from. In another embodiment of the present application, each semiconductor material protruding portion 38 comprises a same semiconductor material as that of the alternating first semiconductor material portions 14R, 20R and 24R of the at least one hard mask capped semiconductor-containing fin structure 30 which it is grown from.

Each semiconductor material protruding portion 38 has an epitaxial relationship with the alternating first semiconductor material portions 14R, 20R, and 24R of the at least one hard mask capped semiconductor-containing fin structure 30 which it is grown from. In some embodiments, each semiconductor protruding portion 38 has a faceted surface.

In some embodiments, and as shown in FIG. 6, each semiconductor material protruding portion 38 has a triangular shape in which the base of the triangle is located on the exposed sidewalls of the alternating first semiconductor material portions 14R, 20R and 24R of the at least one hard mask capped semiconductor-containing fin structure 30. As shown, a space remains between the tip of each triangular shaped semiconductor material protruding portion and its neighboring semiconductor material protruding portion that is formed from exposed alternating semiconductor material portions of a neighboring one hard mask capped semiconductor-containing fin structure 30.

Each semiconductor material protruding portion 38 can be formed utilizing one of the epitaxial growth process mentioned above. Each semiconductor material protruding portion 38 that is formed can be doped or undoped. When a dopant is present, the dopant (i.e., n-type dopant or p-type dopant) can be introduced into each semiconductor material protruding portion 38 during the epitaxial growth process or after epitaxial growth by utilizing one of ion implantation and/or gas phase doping.

In FIG. 6, a semiconductor structure is provided that includes a semiconductor-containing fin structure (14R, 18R, 20R, 22R, 24R and 26R) that is located on a surface of a base layer 12L, wherein the semiconductor-containing fin structure comprises, from bottom to top, and in an alternating manner, at least one first semiconductor material portion (14R, 20R, 24R), and at least one second semiconductor material portion (18R, 22R and 26R), wherein each of the at least one second semiconductor material portions (18R, 22R and 26R) has a width that is less than a width of each of the at least one first semiconductor material portions (14R, 20R, 24R). An oxide cap portion 36P is located on a sidewall of each of the at least one second semiconductor material portions (18R, 22R and 26R), wherein a sidewall surface of the oxide cap portion 36P is vertically coincident with a sidewall surface of each of the at least one first semiconductor material portions (14R, 20R, 24R). A semiconductor material protruding portion 38 is located on the sidewall surface of each of the first semiconductor material portions (14R, 20R, 24R).

Figure 7:
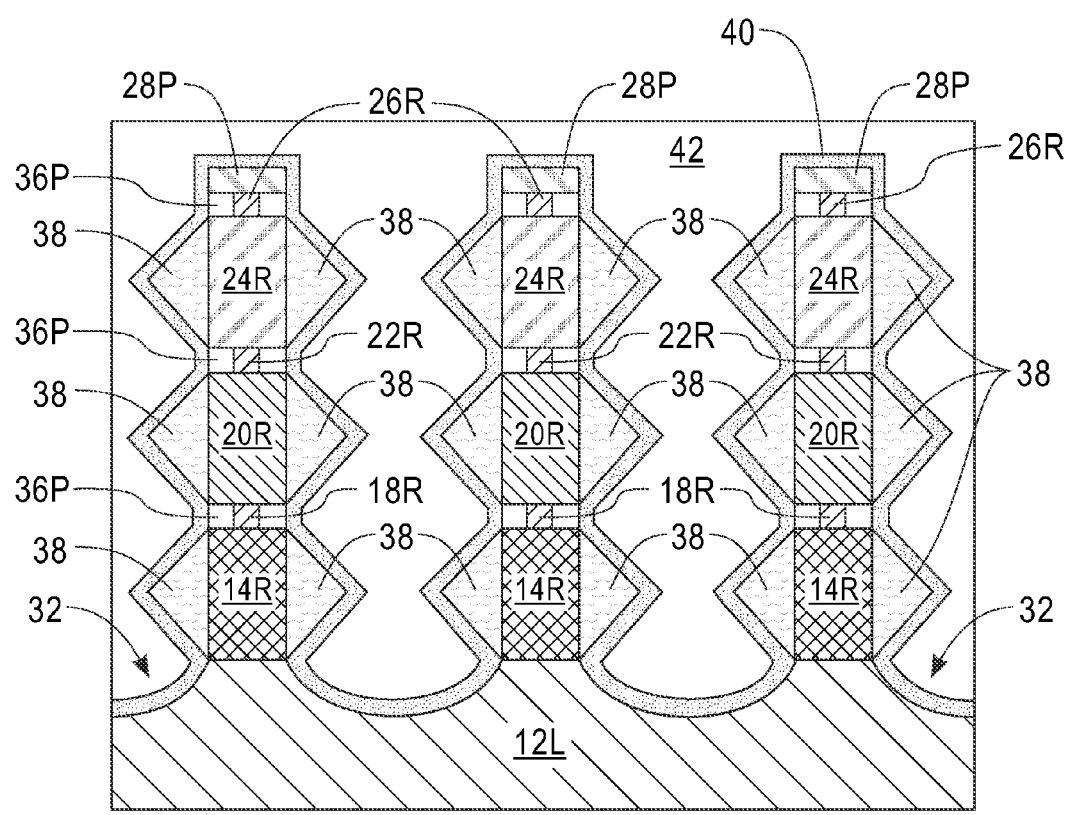
FIG. 7 is cross sectional view of the first exemplary semiconductor structure of FIG. 6 after forming a gate structure.

Referring now to FIG. 7, there is illustrated the first exemplary semiconductor structure of FIG. 6 after forming a gate structure. The gate structure that is formed at this point of the present application is a functional gate structure as defined above. In some embodiments, the gate structure is formed within the gate cavity that was previously formed when removing the sacrificial gate structure. The gate structure includes a gate dielectric material portion 40 that is located on the semiconductor material protruding portions 38 that are located on the exposed alternating semiconductor material portions of the at least one hard mask capped semiconductor-containing fin structure 30, and a gate conductor material portion 42 is located atop the gate dielectric material portion 40.

The gate dielectric material that provides the gate dielectric material portion 40 can be an oxide, nitride, and/or oxynitride. In one example, the gate dielectric material that provides the gate dielectric material portion 40 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

The gate dielectric material used in providing the gate dielectric material portion 40 can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material portion 40. When a different gate dielectric material is used for the gate dielectric material portions, block mask technology can be used. In one embodiment of the present application, the gate dielectric material used in providing the gate dielectric material portion 40 can have a thickness in a range from 1 nm to 10 nm. Other thicknesses that are lesser than or greater than the aforementioned thickness range can also be employed for the gate dielectric material.

The gate conductor material portion 42 comprises a gate conductor material. The gate conductor material used in providing the gate conductor material portion 42 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor material portion 42 may comprise an nFET gate metal, while in yet other embodiments, the gate conductor material portion 42 may comprise a pFET gate metal.

The gate conductor material used in providing the gate conductor material portion 42 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. The gate conductor material may be patterned after formation thereof. When a different gate conductor material is used for the gate conductor portions, block mask technology can be used. In one embodiment, the gate conductor material used in providing the gate conductor material portion 42 has a thickness from 1 nm to 100 nm. Other thicknesses that are lesser than or greater than the aforementioned thickness range can also be employed for the gate conductor material.

In some embodiments of the present application, the gate structure is formed by first depositing a layer of gate dielectric material and a layer of gate conductor material, and then patterning the same by lithography and etching.

Following formation of the gate structure, a dielectric spacer (not shown) can be formed on sidewall surfaces of the gate structure. The dielectric spacer can be comprised of one of the dielectric materials mentioned above and the dielectric spacer can be formed by deposition of the dielectric material and etching.

Source/drain regions (not shown) can be formed in portions of semiconductor-containing fin structures (14R, 18R, 20R, 22R, 24R, 26R) and each semiconductor material protruding portions 38 that are not covered by the gate structure. The source/drain regions can be formed by introducing a dopant into the exposed portions of each semiconductor material, which are not covered by either the gate structure or the sacrificial gate structure. The dopant can be n-type or p-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. In some embodiments, the dopant can be introduced into the exposed portions of each semiconductor material, which are not covered by either the gate structure, by ion implantation or gas phase doping.

In some embodiments, the source/drain regions can be merged. The merging of the source/drain regions can be provided by growing an epitaxial semiconductor material utilizing an epitaxial growth process as defined above.

Reference is now made to FIGS. 8-11 which illustrate another embodiment of the present application. In the embodiment illustrated in FIGS. 8-11, the oxidation process completely consumes alternating second semiconductor material portions of the at least one hard mask capped semiconductor-containing fin structure 30. This embodiment of the present application begins by first providing the structure shown in FIG. 3. Unlike the previous embodiment in which semiconductor-containing fin structures were provided, this embodiment of the present application provides stack semiconductor nanowires.

After providing the structure shown in FIG. 3, an oxidation process is performed in which alternating second semiconductor material portions (18P, 22P and 26P) of the at least one hard mask capped semiconductor-containing fin structure 30 are fully oxidized. The fully oxidized semiconductor portions are labeled as 50 in the drawing of the present invention. During the oxidization process oxide, first liner portion 34 forms on the sidewalls of the first alternating semiconductor material portions (14P, 20P, 24P). The oxidation process that is used to provide the structure shown in FIG. 8 is the same as that described in providing the structure shown, for example, in FIG. 5.

Figure 8:
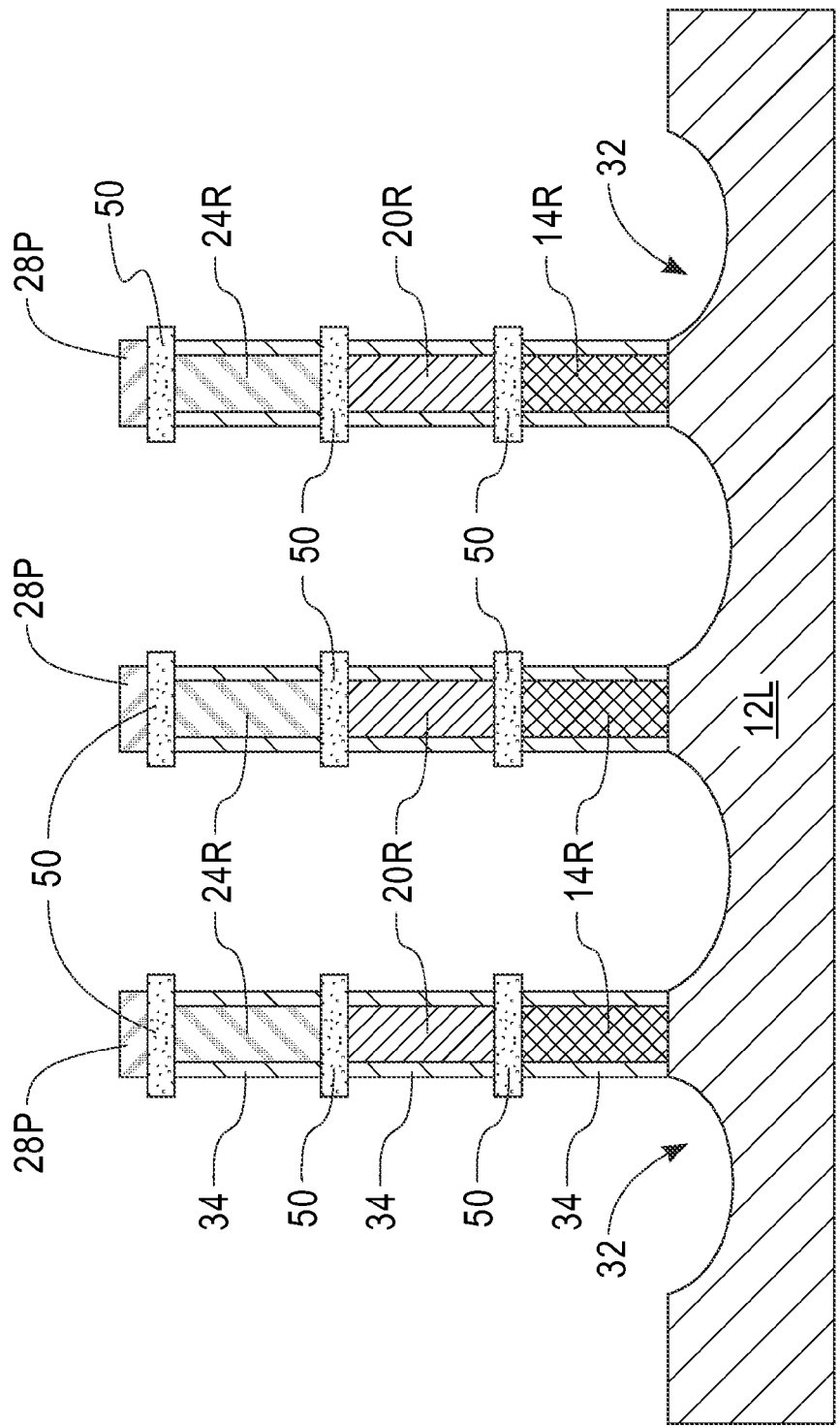
FIG. 8 is a cross sectional view of the first exemplary semiconductor structure of FIG. 3 after performing an oxidation process in which alternating semiconductor material portions of the at least one hard mask capped semiconductor-containing fin structure are fully oxidized in accordance with an alternative embodiment of the present application.
Figure 9:
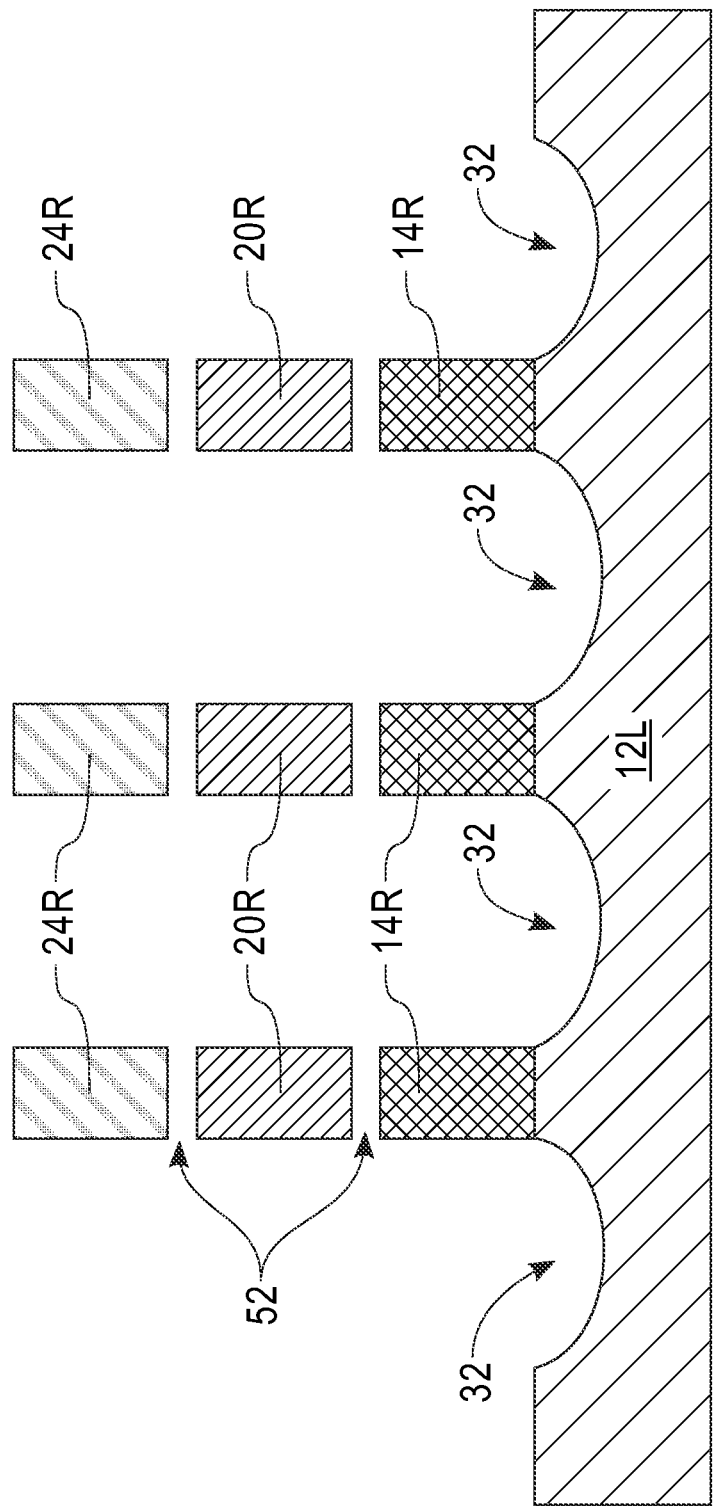
FIG. 9 is a cross sectional view of the first exemplary semiconductor structure of FIG. 8 after performing an oxide removal step.

Referring now to FIG. 9, there is illustrated the semiconductor structure of FIG. 8 after performing an oxide removal step. In this embodiment, the fully oxidized semiconductor portions 50, first oxide liner portion 34 and hard mask portions 28P are removed and there remains alternating first semiconductor material portions (14R, 20R, 24R) which are suspended above each other; the suspended first semiconductor material portions 14R, 20R, 24R can be referred to herein as semiconductor nanowires. In some embodiments, the first semiconductor material portions 14R, 20R, 24R can be subjected to a trimming step at this point of the present application. In some embodiments, an etch may be used to suspend the lowest first semiconductor material portion, i.e., 14R, from the surface of base layer 12L. The alternating first semiconductor material portions (14R, 20R, 24R) are anchored to the substrate by semiconductor pad regions that are located in and out of the drawing. The removal of fully oxidized semiconductor portions 50, first oxide liner portion 34 and hard mask portions 28P can be achieved utilizing an isotropic etch as mentioned above in forming the structure shown in FIG. 6. As shown in FIG. 9, space 52 is formed between each remaining first semiconductor material portion (14R, 20R, 24R).

Figure 10:
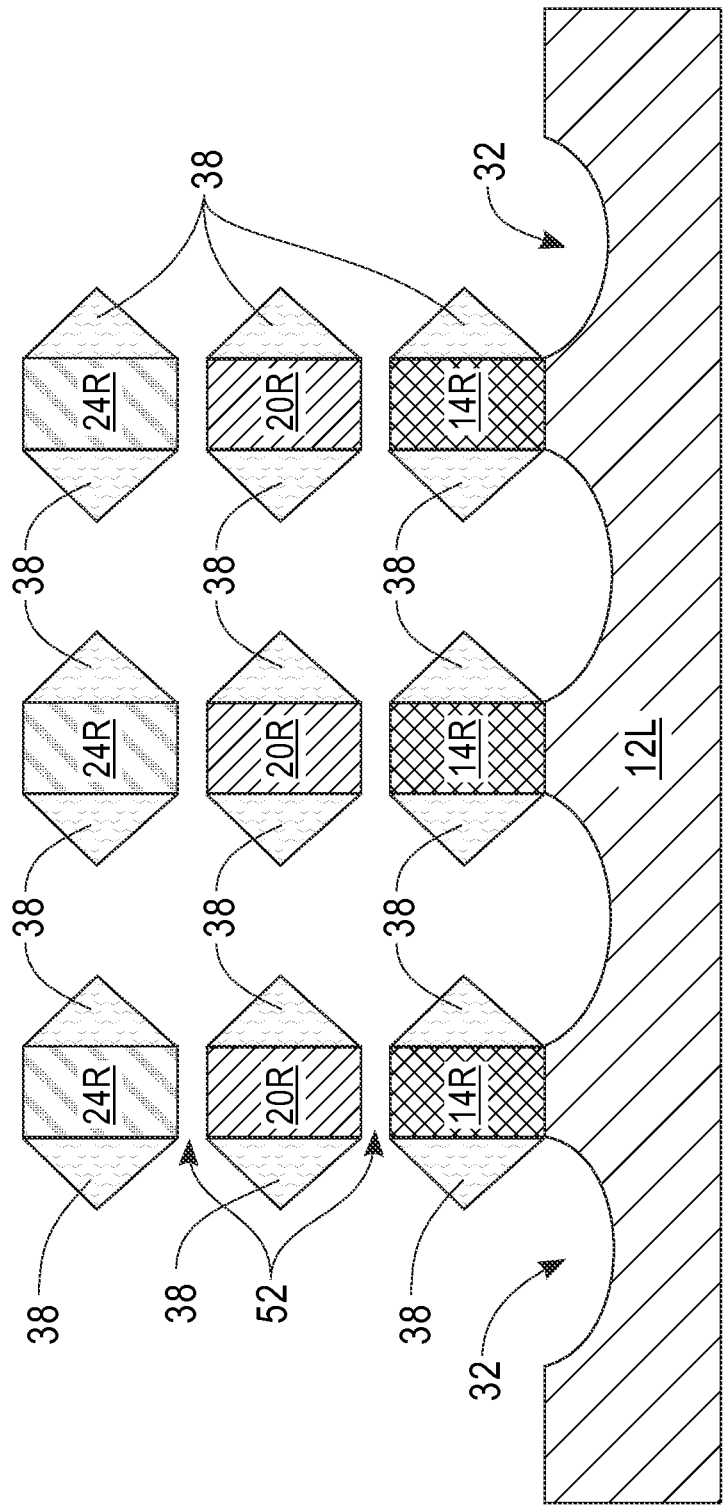
FIG. 10 is a cross sectional view of the first exemplary semiconductor structure of FIG. 9 after epitaxially growing a semiconductor material protruding portion on exposed semiconductor sidewalls of remaining alternating semiconductor material portions of the at least one hard mask capped semiconductor-containing fin structure.

Referring now to FIG. 10, there is illustrated the semiconductor structure of FIG. 9 after epitaxially growing a semiconductor material protruding portion 38 on exposed sidewalls of the remaining alternating first semiconductor material portions (14R, 20R, 24R) of the at least one hard mask capped semiconductor-containing fin structure 30. Each semiconductor material protruding portion 38 can be formed as described above.

In FIG. 10, a semiconductor structure is provided that includes a vertical stack of semiconductor nanowires (14R, 20R, 24R) located atop on a surface of a base layer 12L, and a semiconductor material protruding portion 38 located on a sidewall surface of each of the semiconductor nanowires (14R, 20R, 24R).

Figure 11:
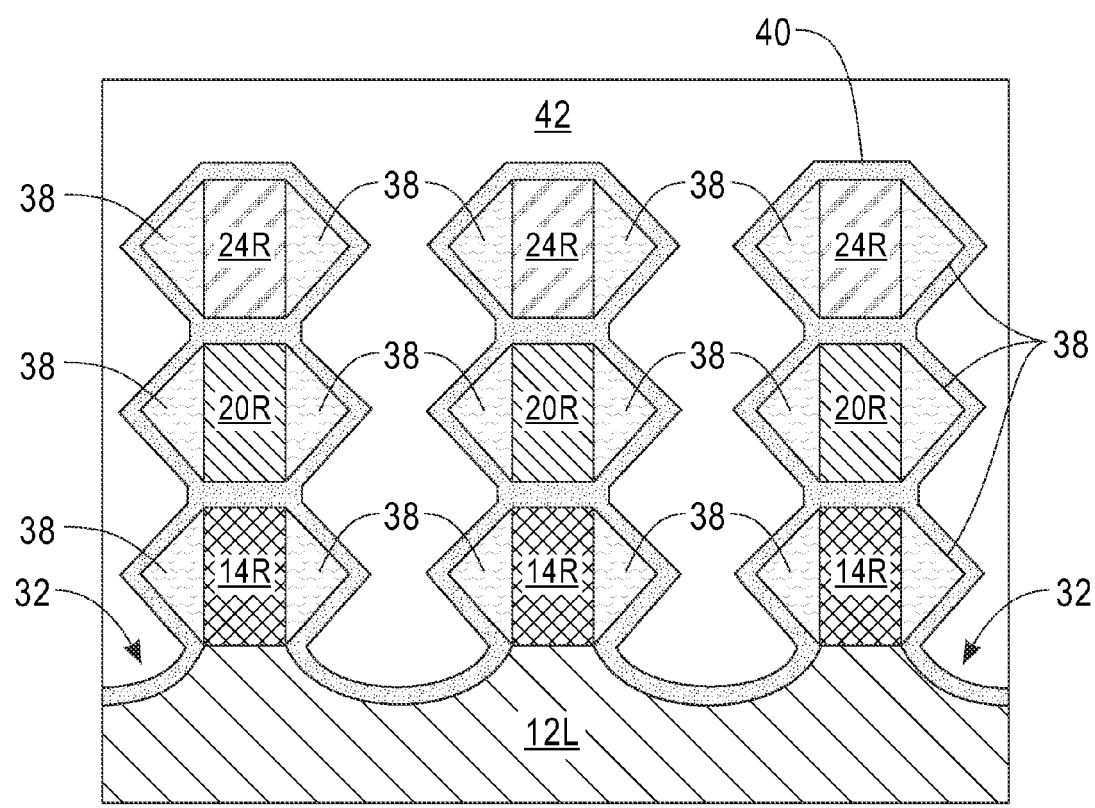
FIG. 11 is cross sectional view of the first exemplary semiconductor structure of FIG. 10 after forming a gate structure.

Referring now to FIG. 11, there is illustrated the structure of FIG. 10 after forming a gate structure including gate dielectric material portion 40 and gate electrode material portion 42. The gate structure can be formed as described above.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   providing a semiconductor-containing fin structure on a surface of a base layer, wherein said semiconductor-containing fin structure comprises, from bottom to top, and in an alternating manner, at least one first semiconductor material portion having a first oxidation rate, and at least one second semiconductor material portion having a second oxidation rate, wherein said first oxidation rate is slower than the second oxidation rate;
   performing an oxidation process to form a continuous oxide liner on semiconductor sidewall surfaces of said semiconductor-containing fin structure, wherein said continuous oxide liner comprises a first oxide liner portion having a first thickness and located on each of said first semiconductor material portions and a second oxide liner portion having a second thickness that is greater than the first thickness and located on each of said second semiconductor material portions;
   completely removing said first oxide liner portion from each of said first semiconductor material portions, while partially removing said second oxide liner portion from each of said second semiconductor material portions; and
   epitaxially growing a semiconductor material protruding portion from an exposed semiconductor sidewall surface of each of said first semiconductor material portions.

2. The method of claim 1, further comprising forming a gate structure surrounding said semiconductor-containing fin structure, wherein said gate structure comprises a gate dielectric material portion and a gate electrode material portion.

3. The method of claim 1, wherein said oxidation process provides remaining first semiconductor material portions having a first thickness and remaining second semiconductor material portions having a second thickness that are less than the first thickness.

4. The method of claim 2, wherein each of said second oxide liner portions has sidewalls that extend beyond sidewalls of each of said first oxide liner portions.

5. The method of claim 1, wherein each of said semiconductor material protruding portions has a shape of a triangular and wherein a base of said triangular is formed directly on said exposed semiconductor sidewall surface of each of said least one first semiconductor material portions.

6. The method of claim 1, wherein said providing the semiconductor-containing fin structure comprises:
   providing a semiconductor-containing layer of a first semiconductor material on said surface of said base layer;
   forming an initial second semiconductor material on said semiconductor-containing layer, wherein said first semiconductor material has said slower oxidation rate than said second semiconductor material;
   forming a hard mask material atop said initial second semiconductor layer; and
   patterning.

7. The method of claim 6, further comprising forming alternating layers of said first semiconductor material and said second semiconductor material on said initial second semiconductor material.

* * * * *